United States Patent
Rantala et al.

(10) Patent No.: US 6,974,970 B2
(45) Date of Patent: Dec. 13, 2005

(54) SEMICONDUCTOR DEVICE

(75) Inventors: Juha T. Rantala, Helsinki (FI); Jason S. Reid, Los Gatos, CA (US); Nungavram S. Viswanathan, San Jose, CA (US); T. Teemu T. Tormanen, Espoo (FI)

(73) Assignee: Silecs Oy, Espoo (FI)

( * ) Notice: Subject to any disclaimer, the term of this patent is extended or adjusted under 35 U.S.C. 154(b) by 179 days.

(21) Appl. No.: 10/346,449

(22) Filed: Jan. 17, 2003

(65) Prior Publication Data

US 2003/0186494 A1 Oct. 2, 2003

Related U.S. Application Data

(60) Provisional application No. 60/414,578, filed on Sep. 27, 2002, provisional application No. 60/395,418, filed on Jul. 13, 2002, and provisional application No. 60/349,955, filed on Jan. 17, 2002.

(51) Int. Cl.[7] .............................................. H01L 35/24
(52) U.S. Cl. ........................ 257/40; 257/642; 257/750; 427/223; 427/535; 430/302
(58) Field of Search .................... 257/40, 642, 750, 257/758–759; 521/122–134; 427/223, 535; 430/302

(56) References Cited

U.S. PATENT DOCUMENTS

| | | |
|---|---|---|
| 4,507,384 A | 3/1985 | Morita et al. ............... 430/311 |
| 4,626,556 A | 12/1986 | Nozue et al. ............... 522/99 |
| 4,983,419 A | 1/1991 | Henkel et al. ............. 427/53.1 |
| 5,593,732 A * | 1/1997 | Griffith .................... 427/407.1 |
| 2001/0053840 A1 * | 12/2001 | Ko et al. ...................... 528/36 |

FOREIGN PATENT DOCUMENTS

| | | |
|---|---|---|
| EP | 0 436 844 A3 | 7/1991 |
| EP | 1 026 213 A1 | 8/2000 |
| JP | 2000-223487 A | 8/2000 |

* cited by examiner

Primary Examiner—Dung A. Le
(74) Attorney, Agent, or Firm—Kubovcik & Kubovcik

(57) ABSTRACT

Thin films are disclosed that are suitable as dielectrics in IC's and for other similar applications. In particular, the invention concerns thin films comprising compositions obtainable by hydrolysis of two or more silicon compounds, which yield an at least partially cross-linked siloxane structure. The invention also concerns a method for producing such films by preparing siloxane compositions by hydrolysis of suitable reactants, by applying the hydrolyzed compositions on a substrate in the form of a thin layer and by curing the layer to form a film. In one example, a thin film comprising a composition is obtained by hydrolyzing a monomeric silicon compound having at least one hydrocarbyl radical, containing an unsaturated carbon-to-carbon bond, and at least one hydrolyzable group attached to the silicon atom of the compound with another monomeric silicon compound having at least one aryl group and at least one hydrolyzable group attached to the silicon atom of the compound to form a siloxane material.

32 Claims, 6 Drawing Sheets

SEMICONDUCTOR DEVICE

This application claims priority under 35 USC 119 to U.S. provisional patent applications 60/349,955 to Reid et al. filed Jan. 17, 2002, 60/395,418 to Rantala et al. filed Jul. 13, 2002, and 60/414,578 to Rantala et al. filed Sep. 27, 2002, the subject matter of each being incorporated herein by reference in their entirety.

BACKGROUND OF THE INVENTION

1. Field of the Invention

The present invention relates to thin films suitable as dielectrics in IC's and for other similar applications. In particular, the invention concerns thin films comprising compositions obtainable by hydrolysis of two or more silicon compounds, which yield an at least partially cross-linked siloxane structure. The invention also concerns a method for producing such films by preparing siloxane compositions by hydrolysis of suitable reactants, by applying the hydrolyzed compositions on a substrate in the form of a thin layer and by curing the layer to form a film.

2. Description of Related Art

Built on a semiconducting substrate, integrated circuits comprise of millions of transistors and other devices, which communicate electrically with one another and outside packaging material through multiple levels of vertical and horizontal wiring embedded in a dielectric material. Within the multilayer metallization structure, "vias" comprise the vertical wiring, whereas "interconnects" comprise the horizontal wiring. Fabricating the metallization can involve the successive depositing and patterning of multiple layers of dielectric and metal to achieve electrical connection among transistors and to outside packaging material. The patterning for a given layer is often performed by a multi-step process consisting of layer deposition, photoresist spin, photoresist exposure, photoresist develop, layer etch, and photoresist removal on a substrate. Alternatively, the metal may sometimes be patterned by first etching patterns into a dielectric, filling the pattern with metal, then subsequently chemical mechanical polishing the metal so that the metal remains embedded only in the openings of the dielectric. As an interconnect material, aluminum has been utilized for many years due to its high conductivity (and low cost). Aluminum alloys have also been developed over the years to improve the melting point, diffusion, electromigration and other qualities as compared to pure aluminum. Spanning successive layers of aluminum, tungsten has traditionally served as the conductive via material. Silicon dioxide (dielectric constant of around 4.0) has been the dielectric of choice, used ill conjunction with aluminum-based and tungsten-based interconnects and via for many years.

The drive to faster microprocessors and more powerful electronic devices in recent years has resulted in very high circuit densities and faster operating speeds, which in turn have required higher conductivity metals and lower-k dielectrics (preferably below 3.0, more preferably below 2.5 dielectric constant). In the past few years, VLSI (and ULSI) processes have been moving to copper damascene processes where copper (or copper alloys) is used for the higher conductance in the conductor lines and spin-on or CVD low-k dielectrics are used for the insulating material surrounding the conductor lines. To circumvent problems with etching, copper along with a barrier metal is blanket deposited over recessed dielectric structures consisting of interconnect and via openings and subsequently polished in a processing method known as "dual damascene." The bottom of the via opening is usually the top of an interconnect from the previous metal layer or in some instances, the contacting layer to the substrate.

In addition to the dielectric IC material being photopatternable, it is also desirable that the material be easy to deposit or form, preferably at a high deposition rate and at a relatively low temperature. Once deposited or formed, it is desirable that the material be easily patterned, and preferably patterned with small feature sizes if needed. Once patterned, the material should preferably have low surface and/or sidewall roughness. It might also desirable that such materials be hydrophobic to limit uptake of moisture (or other fluids), and be stable with a relatively high glass transition temperature (not degrade or otherwise physically and/or chemically change upon further processing or when in use).

Summarizing: aside from possessing a low dielectric constant, the ideal dielectric should afford the following properties:
1) A high modulus and hardness in order to bind the maze of metal interconnects and vias together as well as abet chemical mechanical polishing processing steps.
2) Low thermal expansion, typically less than or equal to that of Al interconnects.
3) Excellent thermal stability, generally in excess of 425° C.
4) No cracking, excellent fill and planarization properties
5) Excellent adhesion to dielectric, semiconductor, and metal materials.
6) Sufficient thermal conductivity to dissipate joule heating from interconnects and vias.
7) Material density that precludes absorption of solvents, moisture, or reactive gasses.
8) Allows well-defined vertical etch profiles at very small dimensions.
9) Low current leakage, high breakdown voltages, and low loss-tangents.
10) Stable interfaces between the dielectric and contacting materials.

By necessity, low-k materials are usually engineered on the basis of compromises. Silicate-based low-k materials can demonstrate exceptional thermal stability and usable modulus but can be plagued by brittleness and cracking. In contrast, organic materials often show improved material toughness, but at the expense of increased softness, lower thermal stability, and higher thermal expansion coefficients. Porous materials sacrifice mechanical properties and possess a strong propensity for absorbing chemicals used in semiconductor fabrication leading to reliability failures. Fluorinated materials can induce corrosion of metal interconnects, rendering a chip inoperative. Universally, low-k materials sacrifice mechanical robustness and thermal conductivity with respect to their pure silicon dioxide analogues, making integration into the fabrication flow very challenging.

Further, known materials comprising exclusively inorganic bonds making up the siloxane matrix are brittle and have poor elasticity at high temperatures.

SUMMARY OF THE INVENTION

It is an object of the present invention to eliminate the problems of the known technical solutions and to provide novel thin films which have excellent mechanical and thermal properties.

It is another object of the invention to provide dielectric layers on silicon wafers.

It is a third object of the invention to provide methods of producing poly(organo siloxane) compositions which are suitable for the preparation of thin films having excellent dielectric properties.

It is a still a fourth object of the invention to provide a method of patterning dielectric films in semiconductor devices.

These and other objects, together with the advantages thereof over the known dielectric thin films and methods for the preparation thereof, which shall become apparent from specification which follows, are accomplished by the invention as hereinafter described and claimed.

The present invention is based on the concept of providing a poly(organo siloxane) material, which exhibits both inorganic and organic bonds within the cured and at least partially cross-linked siloxane composition to give a product which has excellent strength properties and good heat-resistance. The inorganic cross-links are based on the conventional silicon-to-oxygen bonds of a siloxane material. However, in addition to these basically inorganic and partially inflexible bonds, the novel materials also have organic inter- and intra-chain links formed by the carbon-to-carbon bonds. These bonds are derived from the reactions of unsaturated groups, such as alkenyl or alkynyl groups, with other unsaturated groups.

To obtain the new materials, silane reactants of at least two different kinds are used. The first group of silane reactants comprises compounds containing an unsaturated hydrocarbon residue, which will provide for organic cross-linking. The second group of silane reactants comprises compounds containing at least one aryl group. These hydrocarbyl radicals are bonded to the silicon atom of the silane compound (also called a monomeric silicon compound in the following). The reactants are hydrolysed to form an organosiloxane polymer. Therefore, they contain, in addition to the hydrocarbyl radical, also a hydrolysable group bonded to the silicon atom of the silane. In addition to the above reactants, reactants of a third group of silane compounds can be used, which contain a hydrolysable group and an organic saturated group, such as an alkyl group.

According to the method of the present invention, a first silicon compound having the general formula I:

$$X^1{}_{3-a}\text{—SiR}^1{}_b R^2{}_c R^3{}_d \qquad \text{I}$$

wherein $X^1$ represents a hydrolyzable group; $R^1$ is an alkenyl or alkynyl group, which optionally bears one or more substituents; $R^2$ and $R^3$ are independently selected from hydrogen, substituted or non-substituted alkyl groups, substituted or non-substituted alkenyl and alkynyl groups, and substituted or non-substituted aryl groups; a is an integer 0, 1 or 2; b is an integer a+1; c is an integer 0, 1 or 2; d is an integer 0 or 1; and b+c+d=3; is hydrolyzed with a second silicon compound having the general formula II:

$$X^2{}_{3-e}\text{—SiR}^4{}_f R^5{}_g R^6{}_h \qquad \text{II}$$

wherein $X^2$ represents a hydrolyzable group; $R^4$ is an aryl group, which optionally bears one or more substituents; $R^5$ and $R^6$ are independently selected from hydrogen, substituted or non-substituted alkyl groups, substituted or non-substituted alkenyl and alkynyl groups, and substituted or non-substituted aryl groups; e is an integer 0, 1 or 2; f is an integer e+1; g is an integer 0, 1 or 2; h is an integer 0 or 1; and f+g+h=3, optionally together with a third silicon compound having the general formula III:

$$X^3{}_{3-i}\text{—SiR}^7{}_j R^8{}_k R^9{}_l \qquad \text{II}$$

wherein $X^3$ represents a hydrolyzable group; $R^7$ is hydrogen or an alkyl group, which optionally bears one or more substituents; $R^8$ and $R^9$ are independently selected from hydrogen, substituted or non-substituted alkyl groups, substituted or non-substituted alkenyl or alkynyl groups, and substituted or non-substituted aryl groups; i is an integer 0, 1 or 2; j is an integer i+1; k is an integer 0, 1 or 2;1 is an integer 0 or 1; and j+k+l=3.

By the invention, hybrid materials having an inorganic backbone, comprising an metal or metalloid oxide three dimensional network, with organic substituents and cross linking groups, is provided. These materials have applications in the semiconductor industry, in particular as thin films for dielectric layers in IC's. The hybrid materials of the invention provide the combined benefits of low dielectric constant, direct patternability (by exposure to light or particle beam), as well as excellent mechanical, chemical and thermal properties, such as stability, glass transition temperature, ease of handling and deposition, etc.

Generally, the siloxane material can be deposited on a substrate of a semiconductor device, and the siloxane material is heated to cause further cross-linking, whereby a film is obtained, having a shrinkage after heating of less than 10% and a thermal stability of more 425° C.

In another embodiment of the invention, a method comprises: providing a first chlorosilane having an aromatic or non-aromatic ring structure; providing a second chlorosilane having an unsaturated carbon-carbon bond; hydrolyzing the first and second chlorosilanes together to form a siloxane material having a density of 1.45 or more and a dielectric constant of 2.9 or less.

In another embodiment of the invention, a method comprises: providing a first thrichlorosilane having an aromatic or non-aromatic ring structure; providing a second trichlorosilane having an unsaturated carbon-carbon bond; providing a third trichlorosilane having an alkyl group having from one to four carbon atoms; hydrolyzing the first, second and third trichlorosilanes together to form a siloxane material; depositing the siloxane material on a substrate; and patterning the siloxane material to form a dielectric in a semiconductor device.

In another embodiment of the invention, a method comprises: providing a first chlorosilane having an aromatic or non-aromatic ring structure; providing a second chlorosilane having an unsaturated carbon-carbon bond; hydrolyzing the first and second chlorosilanes together to form a siloxane material; depositing the siloxane material on a substrate; patterning the siloxane material by removing siloxane material in selected areas and depositing an electrically conductive material in the selected areas; wherein the final effective dielectric constant of the siloxane material is not different than the dielectric constant of the siloxane material prior to depositing the electrically conductive material.

In another embodiment of the invention, a method comprises: providing a first chlorosilane having a first organic group bound to silicon; providing a second chlorosilane having a second organic group that comprises an unsaturated carbon-carbon bond; hydrolyzing the first and second chlorosilanes together to form a siloxane material having a ratio of the first organic group to the second organic group of 5:1 to 20:1.

In another embodiment of the invention, a method comprises: providing a plurality of silicon compound precursors, the silicon compound precursors selected from chlorosilane precursors, alkoxysilane precursors and silanols; hydrolyzing the plurality of silicon compound precursors to cause cross linking between the precursors so as to form a siloxane material; depositing the siloxane material on a substrate; heating the siloxane material to cause further cross linking;

wherein the shrinkage of the siloxane material after heating is less than 10% and the thermal stability of the siloxane material is better than 425° C.

In another embodiment of the invention, a method comprises: providing a plurality of silicon compound precursors, the silicon compound precursors selected from chlorosilane precursors, alkoxysilane precursors and silanols; hydrolyzing the plurality of silicon compound precursors to cause cross linking between the precursors so as to form a siloxane material; depositing the siloxane material on a substrate; heating the siloxane material to cause further cross linking; patterning the siloxane material to remove siloxane material in selected areas a) by selectively exposing the siloxane material to electromagnetic energy and removing non-exposed areas of siloxane material with a developer, orb) by RIE; wherein the patterning is performed without a capping layer; adding an electrically conductive material in the selected areas; and performing chemical mechanical polishing on the electrically conductive material down to the siloxne material.

In another embodiment of the invention, a method comprises: providing a plurality of silicon compound precursors, the silicon compound precursors selected from chlorosilane precursors, alkoxysilane precursors and silanols; hydrolyzing the plurality of silicon compound precursors to cause cross linking between the precursors so as to form a siloxane material; depositing the siloxane material on a substrate; heating the siloxane material to cause further cross linking, wherein after heating, the volume fraction of pores in the siloxane material is less than 5%; patterning the siloxane material to remove siloxane material in selected areas.

In another embodiment of the invention, a method comprises: providing a plurality of silicon compound precursors, the silicon compound precursors selected from chlorosilane precursors, alkoxysilane precursors and silanols; forming a siloxane material by hydrolyzing the plurality of silicon compound precursors to cause cross linking between the precursors; depositing the siloxane material on a substrate; heating the siloxane material to cause further cross linking; patterning the siloxane material to remove siloxane material in selected areas; wherein the forming of the siloxane material is in the absence of a porogen.

In another embodiment of the invention, a method comprises: providing a first chlorosilane or alkoxysilane having a first organic group bound to silicon; providing a second chlorosilane or alkoxysilane having a second organic group that comprises an unsaturated carbon-carbon bond; hydrolyzing the first and second silanes together to form a siloxane material where from $\frac{1}{25}$ to $\frac{1}{2}$ of the silicon atoms in the siloxane material are crosslinked due to degradation and cross linking from the unsaturated carbon-carbon bond.

DETAILED DESCRIPTION OF THE INVENTION

Next, the invention will be examined more closely by means of the following detailed description and with reference to a number of working examples.

Figure 1:
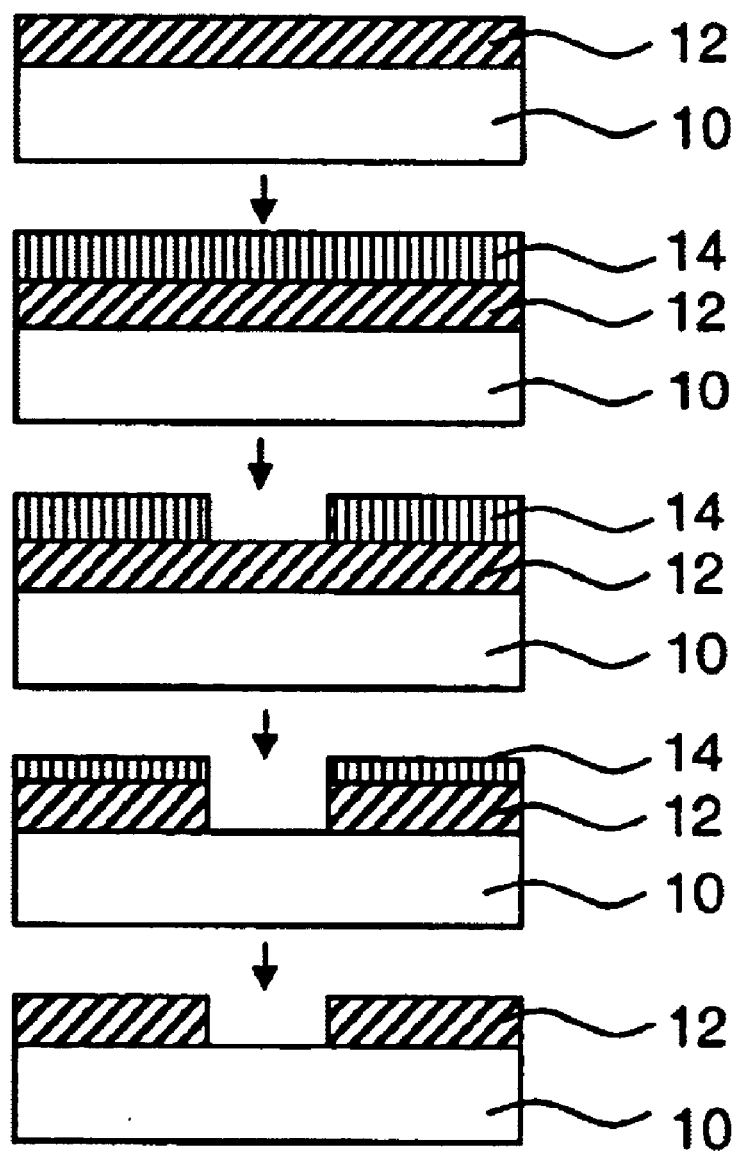
FIG. 1 shows in a schematic fashion the various steps of a process for patterning a dielectric film.

As stated above, the present invention provides novel poly(organosiloxane) materials. These materials are prepared from compounds that can be hydrolyzed and condensed (alone or with one or more other compounds) into a hybrid material having a (weight average) molecular weight of from 500 to 100,000. The molecular weight can be in the lower end of this range (e.g., from 500 to 5,000, or more preferably 500 to 3,000) or the hybrid material can have a molecular weight in the upper end of this range (such as from 5,000 to 100,000 or from 10,000 to 50,000). In addition, it may be desirable to mix a hybrid material having a lower molecular weight with a hybrid material having a higher molecular weight. The hybrid material can be suitably deposited such as by spin-on, spray coating, dip coating, or the like.

THe compounds have an inorganic backbone formed by alternating metal-to-oxygen bonds, the metal being in particular silicon, i.e. —O—Si—O— bonds. In addition to the inorganic metal-to-oxygen bonds forming a basically linear skeleton, there are intermolecular bonds forming cross-links within the material and giving rise to a three-dimensional structure. The cross-links can be based on inorganic bonds between the silicon atoms and the oxygen atoms of the adjacent chains. However, at least some of the bonds are formed by the unsaturated hydrocarbyl radicals bonded to the silicon atoms forming carbon-to-carbon bonds, which link the siloxane chains together. Therefore, the present thin films are preferably formed by compositions comprising cross-linked poly(organosiloxane)s. The reactants contain substituents selected from alkenyl, alkynyl, alkyl, alkyl, halogen etc.

The various definitions used below have the following general meanings—the more specific, typical for the preferred embodiments, are given below in connection with the formulas:

'Alkenyl' as used herein includes straight-chained and branched alkenyl groups, such as vinyl and allyl groups. The term 'alkynyl' as used herein includes straight-chained and branched alkynyl groups, suitably acetylene. 'Aryl' means a mono-, bi-, or more cyclic aromatic carbocyclic group, substituted or non-substituted; examples of aryl are phenyl and naphthyl. More specifically, the alkyl, alkenyl or alkynyl may be linear or branched. Alkyl contains preferably 1 to 18, more preferably 1 to 14 and particularly preferred 1 to 12 carbon atoms. The alkyl is preferably branched at the alpha or beta position with one and more, preferably two, C1 to C6 alkyl groups, especially preferred per-fluorinated alkyl, alkenyl or alkynyl groups. Some examples are non-fluorinated, partially fluorinated and per-fluorinated i-propyl, t-butyl, but-2-yl, 2-methylbut-2-yl, and 1,2-dimethylbut-2-yl. Alkenyl contains preferably 2 to 18, more preferably 2 to 14 and particularly preferred 2 to 12 carbon atoms. The ethylenic, i.e. two carbon atoms bonded with double bond, group is preferably located at the position 2 or higher, related to the Si or M atom in the molecule. Branched alkenyl is preferably branched at the alpha or beta position with one and more, preferably two, C1 to C6 alkyl, alkenyl or alkynyl groups, particularly preferred per-fluorinated alkyl, alkenyl or alkynyl groups.

Alkynyl contains preferably 3 to 18, more preferably 3 to 14 and particularly preferred 3 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, particularly preferred per-fluorinated alkyl, alkenyl or alkynyl groups.

In the context of the disclosure the organic group substituent halogen may also be F, Cl, Br or I atom and is preferably F or Cl. Generally, term 'halogen' herein means a fluorine, chlorine, bromine or iodine atom.

The compositions are preferably obtained by hydrolyzing a first silane having the general formula I:

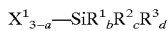

$$X^1_{3-a}-SiR^1_bR^2_cR^3_d \qquad \text{I}$$

with a second silane having the general formula II:

$$X^2_{3-e}-SiR^4_fR^5_gR^6_h \qquad \text{II}$$

Optionally together with a third silane compound having the general formula III:

$$X^3_{3-i}-SiR^7_jR^8_kR^9_l \qquad \text{III}$$

In the above formulas, the groups "X" (i.e. the hydrolysable groups $X^1$, $X^2$ and $X^3$) are groups which are cleaved off by the hydrolysis reaction. They are independently selected from hydroxyl, alkoxy, acyloxy and halogen. It is possible to use silanes wherein the $X^1$, $X^2$ and $X^3$ are different or identical. By using different leaving groups, certain important advantages can be obtained, as will be explained below.

In the preferred hydrolysable groups, $X^1$, $X^2$ and $X^3$ stand for halogen, preferably chlorine or bromine, or an alkoxy group, such as methoxy, ethoxy or propoxy.

In order to provide an organically cross-linked material, there are reactive unsaturated groups present in at least one of the silane reactants. There can be such reactive groups present in two and or more of the reactant groups. Thus, silanes of formulas II and III can contain unsaturated groups bonded to the silicon atom in addition to the aryl or alkyl groups, respectively, also present therein. The unsaturated groups contain double- or triple bonds (—C═C—or —C≡C—). Such groups are represented by alkenyl and alkynyl groups.

In particular, alkenyl groups are preferred because they provide high reactivity combined with reasonable stability. The "alkenyl" has preferably the following meanings in the definitions of substituents $R^1$ to $R^3$, $R^5$, $R^6$, $R^8$ and $R^9$: linear or branched alkenyl group containing 2 to 18, preferably 2 to 14, and in particular 2 to 12 carbon atoms, the ethylenic double bond being located located at the position 2 or higher, the branched alkenyl containing a C1 to C6 alkyl, alkenyl or alkynyl group, which optionally is per-fluorinated or partially fluorinated, at alpha or beta positions of the hydrocarbon chain. Particularly preferred alkenyl groups are vinyl and allyl.

Substituents $R^2$ to $R^6$, $R^8$ and $R^9$ can stand for aryl, which means for a mono-, bi-, or multicyclic aromatic carbocyclic group, which optionally is substituted with C1 to $C_6$ alkyl groups or halogens. The aryl group is preferably phenyl, which optionally bears 1 to 5 substituents selected from halogen alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated)

Substituents $R^2$, $R^3$, $R^5$ to $R^9$ stand for hydrogen, an alkyl group, including linear or branched alkyl groups containing 1 to 18, preferably 1 to 14, and in particular 1 to 12 carbon atoms, the branched alkyl containing a $C_1$ to $C_6$ alkyl, alkenyl or alkynyl group, which optionally is per-fluorinated, at alpha or beta positions of the hydrocarbon chain.

In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl are particularly preferred.

According to a preferred embodiment of the present invention, the thin film according to the invention comprises a siloxane material obtained by hydrolyzing a trichlorosilane having a vinyl group attached to the silicon atom, with a trichlorosilane having a phenyl or naphthyl group attached to the silicon atom. Optionally, a third trichlorosilane having a lower alkyl group attached to the silicon atom is co-hydrolyzed.

Above it is mentioned that the hydrocarbyl groups R are substituted or unsubstituted. According to a preferred embodiment according to the invention, the hydrocarbyl groups are unsubstituted or, if they are substituted, they are substituted by a group different from fluorine.

In the film-making material, the molar ratio between the aryl groups and the groups containing an unsaturated carbon-carbon bond is about 5:1 to 20:1. Similarly, the molar ratio between the alkyl groups and the groups containing an unsaturated carbon-carbon bond is about 5:1 to 20:1.

Thus, in summary: chlorosilanes and in particular trichlorosilanes, each having at least one substituent selected from a multitude of different organic groups—aryl, alkyl, alkenyl, alkynyl . . . and more specifically phenyl, vinyl, epoxy, methyl, ethyl etc., are used as reactants for preparing the present hydrolysis compositions useful for the production of siloxane films.

The poly(organo siloxane) material obtained by the hydrolysis can be formed into thin films by the process, which will be described in more detail below. Such a film is cured and it has a thickness of 0.01 to 10 um, in particular about 0.05 to 2 um.

The thin film exhibits excellent properties as a self-supporting film for dielectric material applications. It has typically a density of 1.45 or more and a dielectric constant of 2.9 or less. The mechanical properties are to improved by the fact that roughly $\frac{1}{25}$ to $\frac{1}{2}$ of the silicon atoms in the siloxane material are cross-linked. This means that at least 80%, preferably at least 90%, in particular at least 95% of the silicon atoms in the siloxane material are inorganically cross-linked, e.g. thermally by curing the film, to form a cross-linked silicon oxide matrix.

As tests have shown, the modulus of the siloxane material is greater than 3.0 GPa. Typically, the shrinkage of the siloxane material after heating is less than 10% and the thermal stability of the siloxane material is better than 425° C.

Furthermore, the surface energy of the cured siloxane materials can be controlled by the stoichiometry of the starting chlorosilanes. The surface is compatible with aqueous and polar solvents and its properties can be further adjusted by the thermal processing (curing, chemical modification etc.) In particular, the surface energy is controlled by the cure ambients.

The surface adheres well to insulators as well as metals to be compatible with IC processing. Thus, the films can be used as low k dielectric films on objects, such silicon wafers.

The present materials are produced by the steps of a) hydrolyzing the above mentioned silanes to produce a siloxane material;

b) depositing the siloxane material in the form of a thin layer; and c) curing the thin layer to form a film.

Typically, the method comprises hydrolyzing the first, second and optionally third silicon compounds in a liquid medium formed by a first solvent to form a hydrolyzed product comprising a siloxane material; depositing the hydrolyzed product on the substrate as a thin layer; and curing the thin layer to form a thin film having a thickness of 0.01 to 10 um. The various solvents, which can be used in the method according to the invention, are discussed below in connection with the working examples.

The hydrolyzed product comprising a siloxane material can be recovered and mixed with a a second solvent to form a solution, which is applied on a substrate. The second solvent is removed to deposit the hydrolyzed product on the substrate as a thin layer, and then the thin layer to form a thin film having a thickness of 0.01 to 10 um.

The above hydrolysis steps of the first, second and third silicon compounds to form a hydrolyzed product and the step of curing the hydrolyzed product are all performed at a temperature of 50 to 425° C. As explained above, the reactants can have identical or different hydrolysable groups.

Hydrolysis of chlorosilanes (containing the hydrolysable group of chlorine), depicted in the below equation 1, is a very spontaneous reaction towards silanol compounds, and it is not a equilibrium reaction as is the hydrolysis of alkoxysilane (equation 2). Therefore, in the presence of water, chlorosilanes are effectively hydrolyzed to form silanols, whereas alkoxysilanes will rather form alkoxysilanols, while at least a percentage of the alkoxy groups remain attached to the silicon after the hydrolysis.

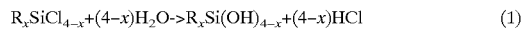
$$R_xSiCl_{4-x}+(4-x)H_2O \rightarrow R_xSi(OH)_{4-x}+(4-x)HCl \quad (1)$$

wherein R stands for a hydrocarbyl residue (cf. the definitions above for the R-residues of the compounds according to formulas I, II and III) and x stands for an integer 0, 1, 2, 3;

$$R_xSi(OR)_{4-x}+(4-x)H_2O \leftrightarrow R_xSi(OR)_{4-x-y}(OH)_y+(4-x-y)ROH+H_2O \quad (2)$$

wherein R and x have the same meaning as above, and y has the value of 4−x.

Now if the material composition contains some number of alkoxide (OR) groups, when the condensation reaction is supposed to happen, the condensation speed and efficiency are limited (which limit how effectively the material densification happens). Actually, and typically, relatively high temperatures (>400° C. or even higher than 700° C.) are required to convert all (essentially 95 to 100%) of the alkoxides to the hydroxyl form and then eventually to condensate them to form a dense Si—O—Si matrix. In addition, this high temperature annealing requirement brings an additional problem to for alkoxide-based organo hybrid materials, which is the stability of the organo moiety (such as methyl, phenyl or perfluoro organo alkyls), since at high annealing temperature the organo moiety may cleavage from the silicon and, thus, the functionality of the material may change.

Therefore, by using chlorosilanes instead of alkoxysilanes to form siloxane materials, a better densification degree is achieved at lower temperatures. However, by using both chlorosilanes and alkoxysilanes the reaction rate can be suitably modified so as to obtain a homogenerous material, as will be explained in the following: Typically siloxane materials are made from the materials, wherein the reacting group (in this context meaning the "hydrolysable group) belongs to same hydrolysable or condensable group. The hydrolysable group can be alkoxy, halogen, acyloxy, hydroxyl, deuteroxyl, carboxyl, nitride or amine. The siloxanes are formed by hydrolyzing and condensating metal or metalloid compounds that contains one or more reacting group so that final material contains at least the Si—O—Si group.

As explained above, the present silane precursors, which contain a hydrolysable group, also comprise organic groups, which are not hydrolyzed during the hydrolyzing steps. These groups are the above mentioned R-groups of alkyl, aryl, alkene, alkyne, epoxy, acrylate, vinyl and partially or perfluorinated of the same. These non-hydrolyzed groups may, however, affect the reactivity of the previously described reacting groups. In addition, the reactivity of materials with different reacting (hydrolysis and/or condensation) groups varies as well. If hetero (two or more different precursors) precursor systems are use in the synthesis of siloxanes the homogeneity of the material may suffer due to the uneven reaction rates of the precursors. It may even lead to the precipitation of other precursor so that it does not take part in the formation of siloxane. However, this can be avoided if precursors comprising different reacting groups are used in the same synthesis so that the precursors are selected to have similar reaction rates. For example, by using combinations of organochlorosilanes and organoalkoxysilanes in the same synthesis it is possible to achieve equal hydrolysis speeds for both precursors.

In some cases it is advantageous to use various reacting groups in one precursor, i.e., alkoxychlorosilane or alkoxyhydroxysilane, to optimize the reaction kinetics and stability.

As explained above, the siloxane material can be deposited on a substrate of a semiconductor device, and the siloxane material patterned to form a dielectric. The patterning of the siloxane material can take place by removing siloxane material in selected areas and depositing an electrically conductive material in the selected areas. A barrier layer can be deposited in the selected areas prior to depositing the electrically conductive material, but it is also possible to have the electrically conductive material deposited in the selected areas without a barrier layer. Such electrically conductive material comprises, e.g., aluminum or copper.

A particularly preferred method according to the invention comprises the steps of hydrolyzing the first, second and third silicon compound to cause cross-linking between the compounds so as to form a siloxane material;

depositing the siloxane material on a substrate;

heating the siloxane material to cause further cross-linking;

patterning the siloxane material to remove siloxane material in selected areas;

adding an electrically conductive material in the selected areas; and performing chemical mechanical polishing on the electrically conductive material down to the siloxne material.

Another preferred embodiment of the invention comprises:

providing a plurality of silicon compound precursors, the silicon compound precursors selected from chlorosilane precursors, alkoxysilane precursors and silanols;

hydrolyzing the plurality of silicon compound precursors to cause cross linking between the precursors so as to form a siloxane material; depositing the siloxane material on a substrate; and heating the siloxane material to cause further cross linking to provide a material, wherein the shrinkage of the siloxane material after heating is less than 10% and the thermal stability of the siloxane material is better than 425° C.

The chemical mechanical polishing properties of the present materials are excellent. The films are essentially non-porous, and by contrast to the known and commercial dilectric siloxane materials, CM polishing does not lead to deterioration of the dielectric properties of the film.

In the above method, the siloxane material can be patterned by by selectively exposing the siloxane material to electromagnetic energy and removing non-exposed areas of siloxane material with a developer. It can also be patterned by RIE. The patterning can be performed without a capping layer.

Thus, according to a further preferred embodiment of the invention, the method comprises
- providing a plurality of silicon compound precursors, the silicon compound precursors selected from chlorosilane precursors, alkoxysilane precursors and silanols;
- hydrolyzing the plurality of silicon compound precursors to cause cross linking between the precursors so as to form a siloxane material; depositing the siloxane material on a substrate;
- heating the siloxane material to cause further cross linking; patterning the siloxane material to remove siloxane material in selected areas
  a) by selectively exposing the siloxane material to electromagnetic energy and removing non-exposed areas of siloxane material with a developer,
  or b) by RIE;
  wherein the patterning is performed without a capping layer;
- adding an electrically conductive material in the selected areas; and
- performing chemical mechanical polishing on the electrically conductive material down to the siloxne material.

After further cross linking, the volume fraction of pores in the siloxane material is less than 5%. These pores are, furthermore, uniformly distributed. Basically, the low pore content is due to the fact that the forming of the siloxane material takes place in the absence of a porogen.

As mentioned above, a high degree of cross-linking is achieved, some even 95% to 100% of the silicon atoms in the siloxane material being inorganically cross-linked in the matrix. This is possible in particular in a process comprising the following steps:
- providing a first chlorosilane or alkoxysilane having a first organic group bound to silicon;
- providing a second chlorosilane or alkoxysilane having a second organic group that comprises an unsaturated carbon-carbon bond;
- hydrolyzing the first and second silanes together to form a siloxane material where from $1/25$ to $1/2$ of the silicon atoms in the siloxane material are crosslinked due to degradation and cross linking from the unsaturated carbon-carbon bond matrix due to the hydrolyzing step.

In the above disclosed preferred embodiments of the invention, the silane reactants and precursors, basically contain hydrocarbyl residues as defined earlier, for example in connection with formulas I to III.

FIG. 1 gives an example of a typical process, which can be used for patterning a dielectric film provided by the present invention. First, a dielectric layer film 12 is deposited on a wafer substrate 10 typically by spin-on or chemical vapor deposition processes. Next, a removable, photosensitive "photoresist" film 14 is spun onto the wafer substrate 10. Afterward, the photoresist 12 is selectively exposed through a mask, which serves as a template for the layer's circuit pattern and is subsequently developed (developer applied to remove either exposed or unexposed areas depending upon the type of resist). The photoresist is typically baked after spin, exposure, and develop. Next, the layer film is etched in a reactive plasma, wet bath, or vapor ambient in regions not covered by the photoresist to define the circuit pattern. Lastly, the photoresist 14 is stripped. The process of layer deposition, photoresist delineation, etching, and stripping is repeated many times during the fabrication process.

Figure 2:
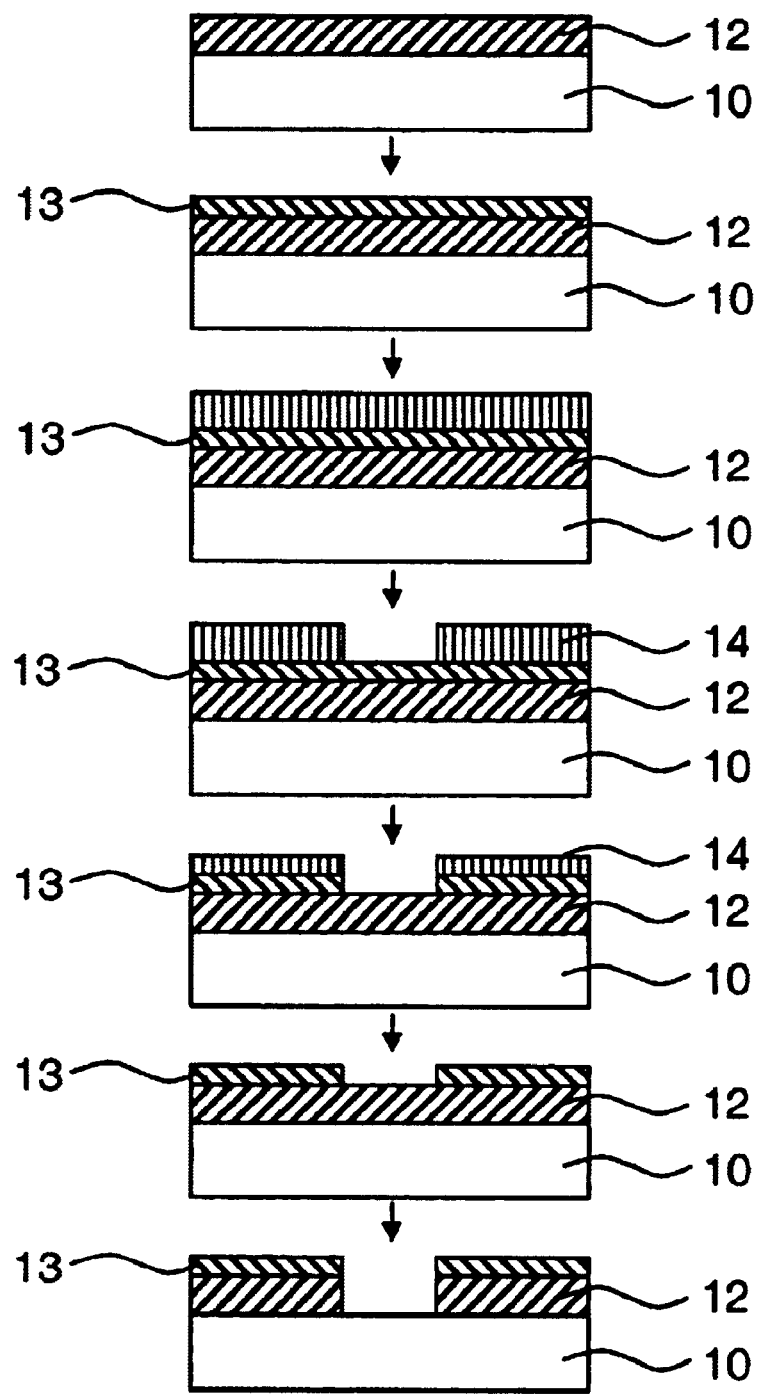
FIG. 2 gives a similar depiction of an alternative process in which a hard mask is inserted between the layered film and the photoresist.

Because photoresist can unacceptably erode during the etch process or may not be able to be adequately delineated within device specifications, a hard mask is sometimes inserted between the layer film and the photoresist (the materials of the invention could also be used for making such a hard mask). FIG. 2 illustrates this typical method, which is similar to the dielectric patterning process described previously in relation to FIG. 1. The layer film could be metal, semiconductor, or dielectric material depending on the application. As can be seen in FIG. 2, a substrate 10 is provided on which is deposited a layer film 12. On film 12 is deposited a hard mask 13. On the hard mask 13 there is deposited a photoresist material 14. The photoreist is exposed and developed so as to selectively expose the underlying hard mask 13. Then, as can be further seen in FIG. 2, the hard mask 13 is etched via the exposed areas in photoresist 12. Thereafter, the photoresist is removed and the dielectric film 12 is etched by using the hard mask 13 as the pattern mask.

Figure 3A:
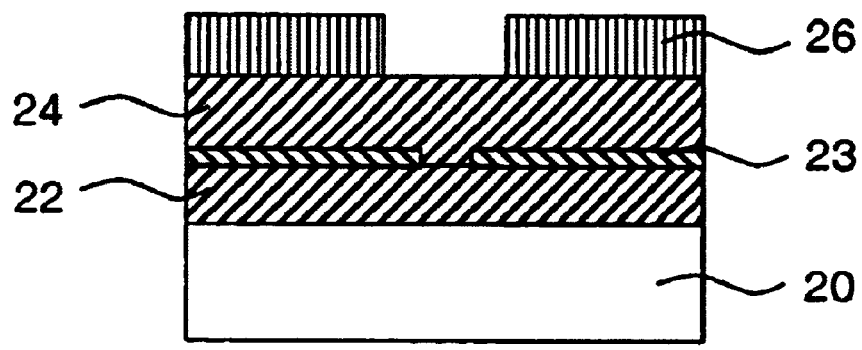
FIG. 3 shows an embodiment of the "dual damascene" process combining dielectric etches and hard masks to form trenches and vias to contain metal interconnects.
Figure 3B:
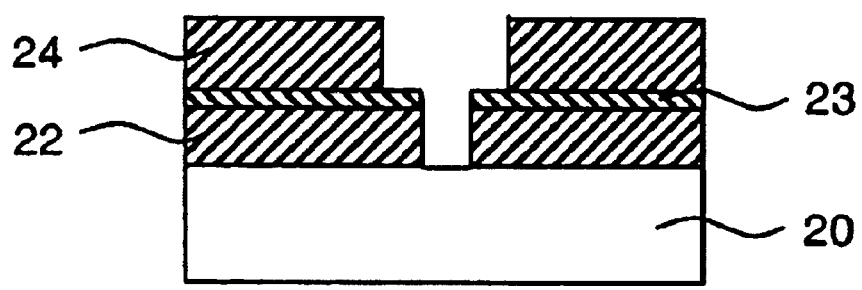
Figure 4:
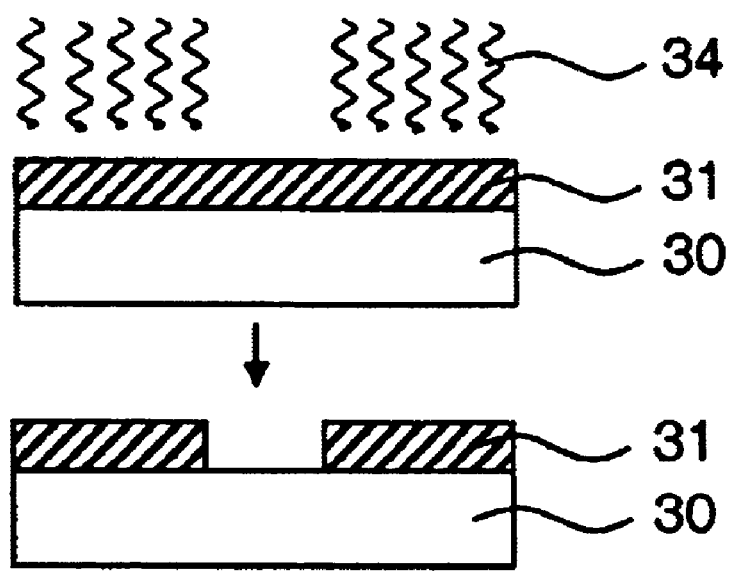
Figure 5:
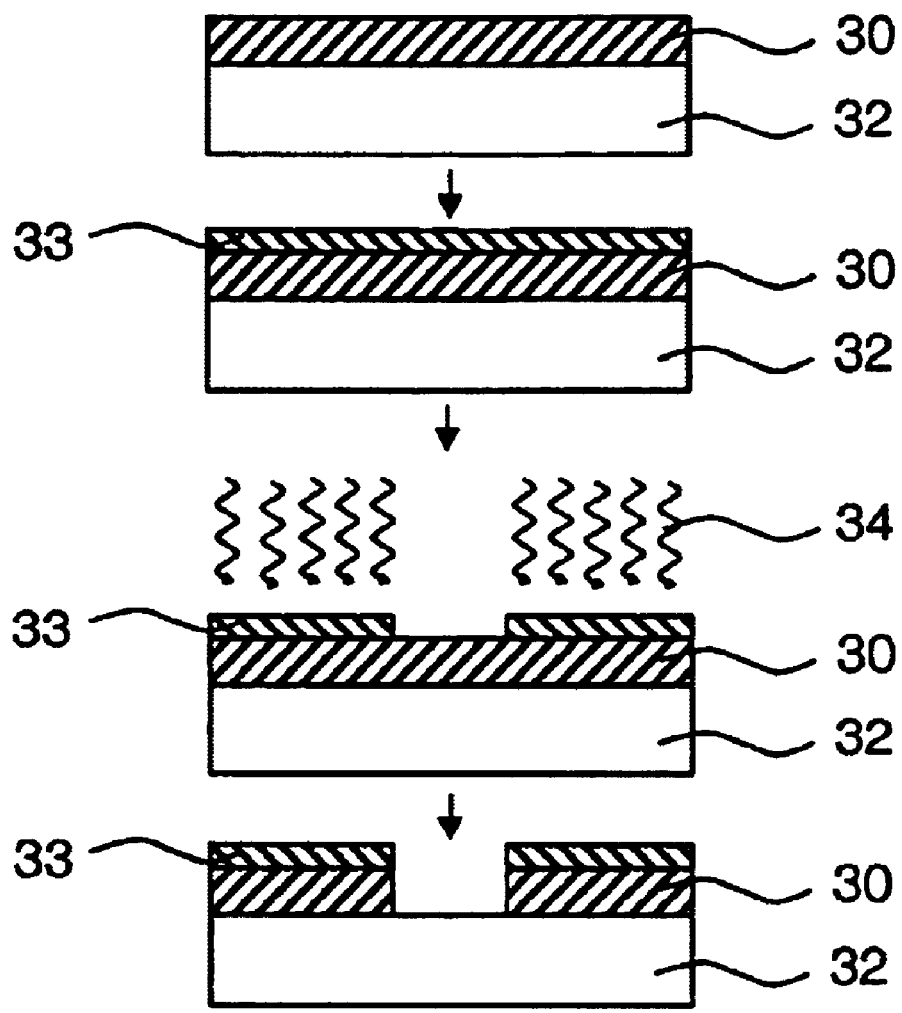
Figure 6:
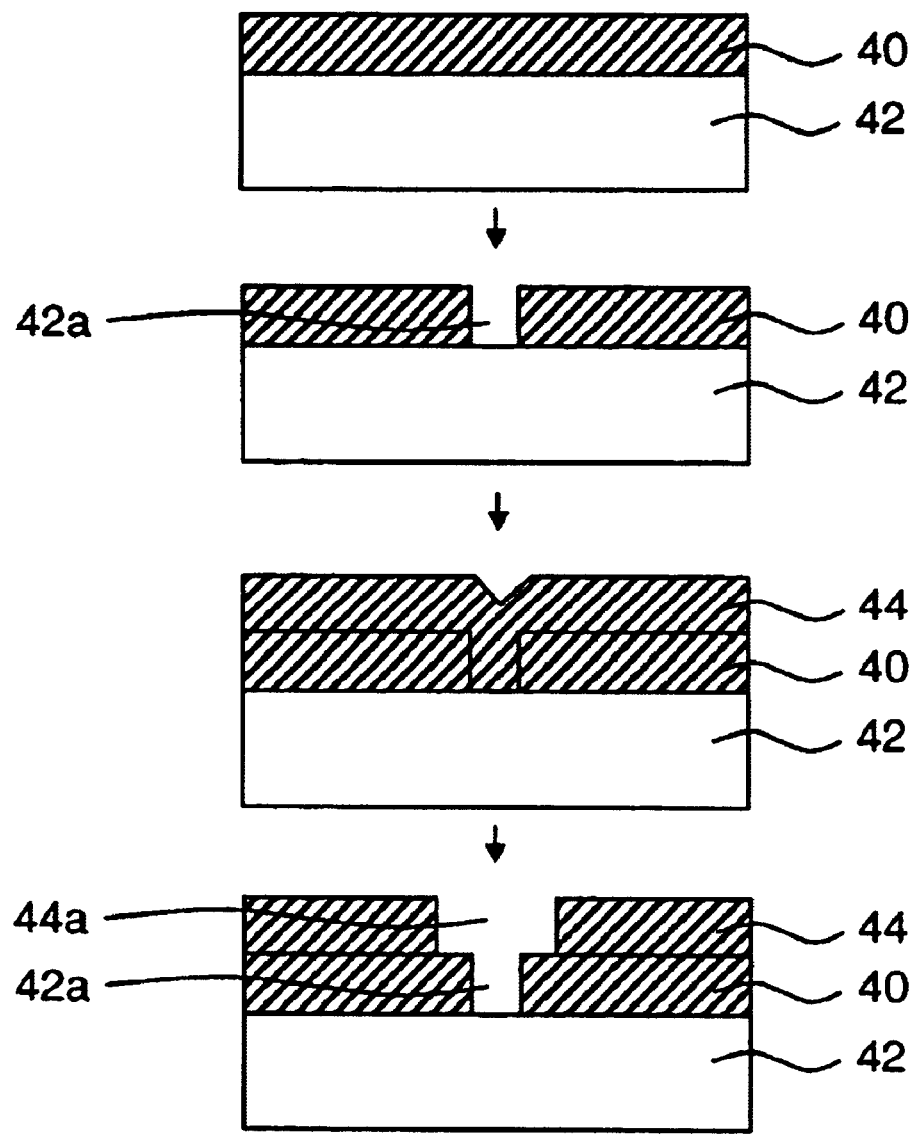

The "dual damascene" process used in integrated circuit application combines dielectric etches and sometimes hard masks to form trenches and vias to contain metal interconnects. FIG. 3 demonstrates one implementation of the technique. From the bottom up in FIG. 3a, the stack is made up of a substrate 20, a dielectric film 22, a hard mask 23, a second dielectric film 24, and a patterned photoresist layer 26. After etching and photoresist strip, a dual-width trench feature is formed as shown in FIG. 3b. The openings are then filled with metal and subsequently polished, leaving metal only within the openings.

The procedures shown in FIGS. 1–3 are often repeated many times during integrated circuit application, which adds to the cost of the circuit and degrades yield. Reducing the number of steps, such as implementing a photopatternable dielectric material of the present new kind, which obviates the need for photoresist and etching steps, has huge benefits to the circuit manufacturer.

MATERIAL SYNTHESIS EXAMPLES

Example 1

Vinyl 0 mole-%

Phenyl trichlorosilane (0.6 mol) and methyl trichlorosilane (0.4 mol) are dissolved in dehydrated DCM (800 ml). The solution is added drop wise into a flask containing excess of water (45 mol) while stirring the solution. After addition of the water, the solution stirred for 1 hour at the room temperature. The solution is neutralized by water extraction for 12 times and finally volatile components are evaporated with rotary evaporator. (After evaporation the mixture is stirred at the room temperature under high vacuum until refractive index of the material is in excess of 1). After vacuum treatment dehydrated 300 w-% of mesitylene is added into the material as for process solvent and the material is carefully homogenized. Appropriate initiators are added and dissolved into the mixture. Finally, the material is filtered.

Example 2

Vinyl 5 mole-%

Vinyl trichlorosilane (0.05 mol), phenyl trichlorosilane (0.57 mol) and methyl trichlorosilane (0.38 mol) are dissolved in dehydrated DCM (800 ml). The solution is added drop-wise into a flask containing excess of water (45 mol) while stirring the solution. After addition of the water, the solution stirred for 1 hour at the room temperature. The solution is neutralized by water extraction for 12 times and finally volatile components are evaporated with rotary evaporator. After vacuum treatment, dehydrated 300 w-% of mesitylene used as process solvent is added into the material and the material is carefully homogenized. Appropriate initiators are added and dissolved into the mixture. Finally the material is filtered.

Example 3

Vinyl 10 mole-%

Vinyl trichlorosilane (0.10 mol), phenyl trichlorosilane (0.54 mol) and methyl trichlorosilane (0.36 mol) are dissolved in dehydrated DCM. The solution is added drop-wise into a flask containing excess of water (45 mol) while stirring the solution. After addition of the water, the solution stirred for 1 hour at the room temperature. The solution is neutralized by water extraction for 12 times and finally volatile components are evaporated with rotary evaporator. After vacuum treatment dehydrated 300 w-% of mesitylene is added into the material as for process solvent and the material is carefully homogenized. Appropriate initiators are added and dissolved into the mixture. Finally the material is filtered.

Examples 4 and 5

Vinyl 20% and 30%

Example 3 was repeated by using 0.20 mole-% and 0.30 mole-% of vinyl trichlorosilane.

The properties of the siloxane compositions are given below in Table 1:

TABLE 1

Properties of Siloxane Compositions

| Composition (mol-%) | Shrinkage | Modulus (Gpa) | Dielectric constant | T Onset |
|---|---|---|---|---|
| Vinyl 0% (Ph: Metri 50—50) | 6.83% | 2.64 | 2.77 | 430° C. |
| Vinyl 5% (JH415A) | 3.10% | 4.55 | 2.84 | 440° C. |
| Vinyl 10% (MHK210A) | 1.81 % | 4.90 | 2.85 | |
| Vinyl 20% (JH416A) | 3.15% | 7.10 | 2.96 | 420° C. |
| Vinyl 30% (MHK211A) | 7.97% | 7.03 | 3.15 | |

T Onset = temperature where thermal degradation has been detected to initiate when sample was heated under nitrogen atmosphere using heating rate of 5° C./min.

To characterize the surface tension (free surface energy) of the material compositions contact angles of various film compositions were determined with deionized water. The surface tension and free surface energy are directly proportional to the water contact angle of the film. Based on the contact angle measurements presented in Table X it can be concluded that with increasing vinyl concentration in the film composition, degreases the contact angle. Therefore, to limit moisture adsorption to the film low vinyl concentrations are preferred in the CMOS and IC applications (while maintaining all other required film properties).

TABLE 2

Contact Angle of Thin Films

| Composition (mole-%) | Contact angle |
|---|---|
| Vinyl 0% (Ph: Metri 50—50) | 92.8° |
| Vinyl 5% | 90.5° |
| Vinyl 10% | 79.4° |
| Vinyl 20% | 86.9° |
| Vinyl 30% | 72.6° |

The film porosity was characterized based on a commercial porositymeter (Xpeqt), where the refractive index of the film is detected as a function of toluene pressure, which can be then further applied for film porosity analysis. For the porosity characterization the composition with 5-mol % of vinyl was selected. Based on the analysis the film exhibits, after 425° C. annealing, nearly molecular level porosity (pore size <1 nm). The average pore size of the film is approximately 0.55 nm. Therefore, the studied material can be considered as non-porous material compared to other spin-on-dielectric materials, which exhibit very high porosities—typically up to 50% of the film volume with average pore size higher than 1 nm.

Alternative Procedures for Each Stage:

Instead of DCM (dichloromethane) as a solvent any pure solvent or a mixture of solvents/alternate solvents can be used either by themselves or in combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carb methylcyclohexane, chlorobenzene. Water used in the reaction can be dissolved into pure or mixtures of following solvents: acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene. In place of water, the following reagents can be used: deuterium oxide ($D_2O$) or HDO. A part of the water can be replaced with the following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. Water can be added into the precursor solution. Even less than an equivalent amount of water can be used.

Instead of water extraction, neutralization (removal of the hydrochloric acid) can be performed using the following chemicals: sodium hydrogen carbonate ($NaHCO_3$), pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or a straight/branched chain $C_xH_y$, x<10, as for example in triethylamine, or heteroatom containing as for example in triethanol amine), trialkyl ammonium hydroxides ($R_3NOH$, $R_3N$, wherein R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Acidic or basic water solution can be used in the extraction. Neutralization can be performed also with azeotropic water evaporation. Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol. The formed solution is evaporated to dryness. The material is dissolved again into the same mixture of water and the solvent. Evaporation and addition cycle is repeated until pH value of the material solution is 7. The solvent is then evaporated with rotary evaporator. The pressure in this stage can be in a large range. The material can be heated while vacuum treatment.

The molecular weight of formed polymer can be increased by using base or acid catalyzed polymerizations. By increasing the molecular weight, the mechanical properties of the film can be improved. On the other hand, a too large molecular weight may impair the film-forming process, e.g. the spinning. Thus, by controlling the molecular weight of the hydrolysed composition, processing of the composition and the properties of the film can be adjusted.

In the following, the procedures for increasing the molecular weight are described in more detail:

Procedure for acid catalyzed polymerization: The pure material is dissolved into any appropriate solvent, such as tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, or methyl-isobutyl ketone. Into the solution, a a catalytic amount of an acid, such as triflic acid, monofluoro acetic acid, trifluoro acetic acid, trichloro acetic acid, dichloro acetic acid, monobromo acetic acid, is added. The solution is refluxed for few hours or until polymerization has reched the desired level while water formed in the reaction is removed. After polymerization, the acid catalyst is removed from tie material solution completely, for example by using solvent extraction or other methods described in alternative neutralization section. Finally, the solvent is removed.

Procedure for base catalyzed polymerization: The pure material is dissolved into any appropriate solvent, such as tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, or methyl-isobutyl ketone. Into the solution, a catalytic amount of a base, such as triethanol amine, triethyl amine, pyridine, ammonia, or tributyl ammonium hydroxide, is added. The solution is refluxed for few hours or until polymerization is reached the desired level while water formed in the reaction is removed. After polymerization, the base catalyst is removed from the material solution completely, for example by adding acidic water solution into the material solution. After that, the acidic solution is neutralized using solvent extraction or other methods described in alternative neutralization section. Finally, solvent is removed.

In the place of mesitylene it is possible to use pure or mixture of following solvents: methyl-isobutyl ketone, 2-propanol, ethanol, methanol, 1-propanol, tetrahydrofuran, acetone, nitromethane, chlorobenzene, dibutyl ether, cyclohexanone, 1,1,2,2-tetrachloroethane, trichloroethanes, ethyl lactate, 1,2-propanediol monomethyl ether acetate, carbon tetrachloride, perfluoro toluene, perfluoro p-xylene, perfluoro iso-propanol, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl) benzene or Rhodosil 2074. Thermal initiators which can be used are benzoyl peroxide, 2,2'-azobisisobutyronitrile. 1,1'-Azobis(cyclohexanecarbo-nitrile), tert-butyl hydroperoxide, Dicumyl peroxide and Lauroyl peroxide. Not necessarily limited to these. Thermal initiators are optimized for their reactivity, thermal stability as well as chain transfer efficiencies. Typical radical initiators listed below work well with the system as well as other charge transfer catalysts that can be used as initiators.

Anhydrous inorganic compounds, including but not limited to sulfate compounds such as sodium sulfate ($Na_2SO_4$) or magnesium sulfate ($MgSO_4$), may be used to remove water and moisture out of organic as well as organic-inorganic solutions. These compounds are insoluble to most organic solvents and they easily bind water to so called crystal water.

This innovation describes the usage of anhydrous inorganic compounds as novel and effective drying (removal of water) agents of metalalkoxide and organo-metal chloride based optical materials in ethyl acetate, toluene or tetrahydrofurane solutions. Removal of water and moisture is crucial to minimize optical losses due the entrapped water molecules into the final optical material. The drying is proceeded by adding appropriate amount of drying agent into the solution. The amount was based on character of the drying agent and on amount of water to be removed. It is safe to use excess of the drying agent. The dried solution was then filtered and the solvent was evaporated off. Trace of solvent was removed with high vacuum treatment.

Tetrahydrofurane, ethyl acetate and toluene form azeotrope with water when boiled. So if the drying with these agents was not complete the remaining water was removed when the solvent was evaporated.

The use of drying agents may slightly increase inorganic impurities of the optical material at least if the drying is not completed before evaporation of the solvent.

The resulting material is water free and therefore highly suitable to be used as a low-loss optical depositable (e.g. spin-on) material for telecommunication applications.

What is claimed is:

1. A thin film comprising a composition obtained by hydrolyzing
    a monomeric silicon compound having at least one hydrocarbyl radical, containing an unsaturated carbon-to-carbon bond, and at least one hydrolyzable group attached to the silicon atom of the compound with
    another monomeric silicon compound having at least one aryl group and at least one hydrolyzable group attached to the silicon atom of the compound to form a siloxane material.

2. The thin film according to claim 1, wherein the composition comprises a cross-linked poly(organosiloxane).

3. The thin film according to claim 2, wherein ⅟25 to ½ of the silicon atoms in the siloxane material are cross-linked.

4. The thin film according to claim 2, wherein at least 80% of the silicon atoms in the siloxane material are inorganically cross-linked to form a silicon oxide matrix.

5. The thin film according to claim 4, wherein at least 90% of the silicon atoms in the siloxane material are inorganically cross-linked to form a silicon oxide matrix.

6. The thin film according to claim 4, wherein at least 95% of the silicon atoms in the siloxane material are inorganically cross-linked to form a silicon oxide matrix.

7. The thin film according to claim 2, wherein the modulus of the siloxane material is greater than 3.0 GPa.

8. The thin film according to claim 1, wherein the composition comprises a poly(organosiloxane) obtained by hydrolyzing a first silicon compound having the general formula I:

   I wherein $X^1$ represents a hydrolyzable group;
$R^1$ is an alkenyl or alkynyl group, which optionally bears one or more substituents;
$R^2$ and $R^3$ are independently selected from hydrogen, substituted or non-substituted alkyl groups, substituted or non-substituted alkenyl and alkynyl groups, and substituted or non-substituted aryl groups;
a is an integer 0, 2 or 2;
b is an integer a+1;
c is an integer 0, 1 or 2;
d is an integer 0 or 1; and
b+c+d=3 with a second silicon compound having the general formula II:

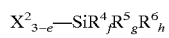   II wherein $X^2$ represents a hydrolyzable group;
$R^4$ is an aryl group, which optionally bears one or more substituents;
$R^5$ and $R^6$ are independently selected from hydrogen, substituted or non-substituted alkyl groups, substituted or non-substituted alkenyl and alkynyl groups, and substituted or non-substituted aryl groups;
e is an integer 0, 1 or 2;
f is an integer e+1;
g is an integer 0, 1 or 2;
h is an integer 0 or 1; and
f+g+h=3.

9. The thin film according to claim 8, wherein the composition is obtained by hydrolyzing the first and the second silicon compounds with a third silicon compound having the general formula III:

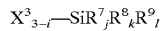   III wherein $X^3$ represents a hydrolyzable group;
$R^7$ is hydrogen or an alkyl group, which optionally bears one or more substituents;
$R^8$ and $R^9$ are independently selected from hydrogen, substituted or non-substituted alkyl groups, substituted or non-substituted alkenyl or alkynyl groups, and substituted or non-substituted aryl groups;
i is an integer 0, 1 or 2;
j is an integer i+1;
k is an integer 0, 1 or 2;
l is an integer 0 or 1; and
j+k+l=3.

10. The thin film according to claim 9, wherein the molar ratio between the alkyl groups and the groups containing an unsaturated carbon-carbon bond is 5:1 to 20:1.

11. The thin film according to claim 8, wherein the hydrolysable groups $X^1$, $X^2$ and $X^3$ are independently selected from hydroxyl, alkoxy, acyloxy and halogen.

12. The thin film according to claim 11, wherein the hydrolysable groups $X^1$, $X^2$ and $X^3$ are different.

13. The thin film according to claim 11, wherein the hydrolysable groups $X^1$, $X^2$ and $X^3$ are identical.

14. The thin film according to claim 13, wherein each of the hydrolysable groups $X^1$, $X^2$ and $X^3$ stands for halogen.

15. The thin film according to claim 14, wherein the halogen is chlorine or bromine.

16. The thin film according to claim 8, wherein alkenyl in the meaning of substituents $R^1$ to $R^3$, $R^5$, $R^6$, $R^8$ and $R^9$ stands for a linear or branched alkenyl group containing 2 to 18 carbon atoms, the ethylenic double bond being located located at the position 2 or higher, the branched alkenyl containing a C1 to C6 alkyl, alkenyl or alkynyl group, which optionally is per-fluorinated or partially fluorinated, at alpha or beta positions of the hydrocarbon chain.

17. The thin film according to claim 16, wherein the alkenyl group is vinyl or allyl.

18. The thin film according to claim 16, wherein the linear or branched alkenyl group contains 2 to 14 carbon atoms.

19. The thin film according to claim 16, wherein the linear or branched alkenyl group contains 2 to 12 carbon atoms.

20. The thin film according to claim 8, wherein aryl in the meaning of substituents $R^2$ to $R^6$, $R^8$ and $R^9$ stands for a mono-, bi-, or multicyclic aromatic carbocyclic group, which optionally is substituted with $C_1$ to $C_6$ alkyl groups or halogens.

21. The thin film according to claim 20, wherein the aryl group is phenyl, which optionally bears 1 to 5 substituents selected from halogen alkyl or alkenyl on the ring, or naphthyl, which optionally bear 1 to 11 substituents selected from halogen alkyl or alkenyl on the ring structure, the substituents being optionally fluorinated.

22. The thin film according to claim 8, wherein alkyl in the meaning of substituents $R^2$, $R^3$, $R^5$ to $R^9$ stands for a linear or branched alkyl group containing 1 to 18 carbon atoms, the branched alkyl containing a $C_1$ to $C_6$ alkyl, alkenyl or alkynyl group, which optionally is per-fluorinated, at alpha or beta positions of the hydrocarbon chain.

23. The thin film according to claim 22, wherein the alkyl group is a lower alkyl containing 1 to 6 carbon atoms, which optionally bear 1 to 3 substituents selected from methyl and halogen.

24. The thin film according to claim 22, wherein the linear or branched alkyl group contains 1 to 14 carbon atoms.

25. The thin film according to claim 22, wherein the linear or branched alkyl group contains 1 to 22 carbon atoms.

26. The thin film according to claim 8, comprising a cured thin layer of the poly(organosiloxane) having a thickness of 0.01 to 10 um.

27. The thin film according to claim 1, wherein the material is obtained by hydrolyzing a trichlorosilane having a vinyl group attached to the silicon atom, with a trichlorosilane having a phenyl or naphthyl group attached to the silicon atom.

28. The thin film according to claim 1, wherein the material is obtained by hydrolyzing a trichlorosilane having a vinyl group attached to the silicon atom, with a trichlorosilane having a phenyl or naphthyl group attached to the silicon atom and with a trichlorosilane having a lower alkyl group attached to the silicon atom.

29. The thin film according to claim 1, wherein the molar ratio between the aryl groups and the groups containing an unsaturated carbon-carbon bond is 5:1 to 20:1.

30. The thin film according to claim 1, having a density of 1.45 or more and a dielectric constant of 2.9 or less.

31. An object comprising a low k dielectric film, the film comprising a material according to claim 1.

32. The object according to claim 31, wherein the object comprises a semiconductor wafer or portion of a semiconductor wafer.

* * * * *